United States Patent
Saito et al.

(10) Patent No.: US 8,569,674 B2
(45) Date of Patent: Oct. 29, 2013

(54) MULTIPLEXED PHOTOCURRENT MONITORING CIRCUIT COMPRISING CURRENT MIRROR CIRCUITS

(75) Inventors: Ryosuke Saito, Yokohama (JP); Hisanobu Tanigawa, Yokohama (JP); Takashi Goh, Atsugi (JP); Ryoichi Kasahara, Atsugi (JP)

(73) Assignees: Nippon Telegraph and Telephone Corporation, Tokyo (JP); NTT Electronics Corporation, Yokohama-Shi, Kanagawa (JP)

( * ) Notice: Subject to any disclaimer, the term of this patent is extended or adjusted under 35 U.S.C. 154(b) by 679 days.

(21) Appl. No.: 12/673,895

(22) PCT Filed: Aug. 21, 2007

(86) PCT No.: PCT/JP2007/066208
§ 371 (c)(1),
(2), (4) Date: Feb. 17, 2010

(87) PCT Pub. No.: WO2009/025033
PCT Pub. Date: Feb. 26, 2009

(65) Prior Publication Data
US 2011/0101208 A1    May 5, 2011

(51) Int. Cl.
*H03F 3/08* (2006.01)
(52) U.S. Cl.
USPC .................................. 250/214 A; 250/214 R
(58) Field of Classification Search
USPC ............... 250/214 R, 214.1, 214 A, 206, 205, 250/214 LS, 208.2, 214 L, 214 SW; 330/59, 330/288, 308, 277; 327/51–53, 511, 514, 327/515
See application file for complete search history.

(56) References Cited

U.S. PATENT DOCUMENTS

| | | | |
|---|---|---|---|
| 5,252,820 A | | 10/1993 | Shinomiya |
| 5,693,934 A | * | 12/1997 | Hohmoto et al. ......... 250/214 A |
| 5,783,951 A | | 7/1998 | Inoue et al. |
| 6,188,059 B1 | | 2/2001 | Nishiyama et al. |
| 6,333,804 B1 | * | 12/2001 | Nishiyama et al. ........... 398/202 |

(Continued)

FOREIGN PATENT DOCUMENTS

| | | |
|---|---|---|
| EP | 1 770 694 A2 | 4/2007 |
| JP | 2-232781 | 9/1990 |

(Continued)

OTHER PUBLICATIONS

International Preliminary Report on Patentability and Written Opinion issued in PCT Application No. PCT/JP2007/066208 on Mar. 18, 2010 (English translation).

(Continued)

*Primary Examiner* — Que T Le
*Assistant Examiner* — Jennifer Bennett
(74) *Attorney, Agent, or Firm* — Workman Nydegger

(57) ABSTRACT

A low cost photocurrent monitoring circuit is provided. A photocurrent monitoring circuit, which performs monitoring by converting photocurrents output from a plurality of photodiodes (PD1 to PDn) into voltage, includes: a multiplexer circuit (MUX) for selecting one of input terminals to establish a connection of the selected input terminal to an output terminal, wherein the photodiodes (PD1 to PDn) are respectively connected to the input terminals; and an amplifier (LA) for converting a photocurrent which flows from a selected photodiode via the multiplexer circuit (MUX) into a voltage, and for outputting the voltage.

13 Claims, 6 Drawing Sheets

(56) References Cited

U.S. PATENT DOCUMENTS

| | | | |
|---|---|---|---|
| 6,765,189 B1* | 7/2004 | Sahu et al. | 250/214 A |
| 7,002,128 B2* | 2/2006 | Hedin et al. | 250/205 |
| 7,075,050 B2* | 7/2006 | Mizuno | 250/214 R |
| 2007/0057160 A1* | 3/2007 | Kaku et al. | 250/214 R |
| 2007/0086311 A1 | 4/2007 | Higashiyama et al. | |
| 2008/0129369 A1* | 6/2008 | Ivancevic et al. | 327/410 |

FOREIGN PATENT DOCUMENTS

| | | |
|---|---|---|
| JP | 5-300042 | 11/1993 |
| JP | 9-107246 | 4/1997 |
| JP | 9-266418 | 10/1997 |
| JP | 10-145337 | 5/1998 |
| JP | 11-284445 | 10/1999 |
| JP | 2001-202646 | 7/2001 |
| JP | 2003-163413 | 6/2003 |
| JP | 2005-223638 | 8/2005 |
| JP | 2007-66469 | 3/2007 |

OTHER PUBLICATIONS

E.J. Newman, *Logarithmic Processing Applied to Network Power Monitoring*, National Fiber Optic Conference, 2002 Technical Proceedings, pp. 1292-1298.

Office Action for related Japanese application No. 2006-055452 on Oct. 27, 2009 with English translation.

* cited by examiner

MULTIPLEXED PHOTOCURRENT MONITORING CIRCUIT COMPRISING CURRENT MIRROR CIRCUITS

TECHNICAL FIELD

The present invention relates to a photocurrent monitoring circuit, and more particularly, relates to a photocurrent monitoring circuit that performs monitoring by converting photocurrents output from a plurality of photodiodes into voltages, and by performing time division multiplexing for the voltages.

BACKGROUND ART

Wavelength-division multiplexing has recently become popular, and for this, an optical transmitter has been employed that outputs optical signals having different wavelengths. This optical transmitter employs photodiodes (PDs) to individually monitor the optical output from each laser diode (LD) which is light source, and thereby provides feedback control for maintaining, at a predetermined level, the intensity of the light output from each LD. Specifically, the current provided for driving the LDs is controlled according to a current (hereinafter referred to as a photocurrent) output from the PDs corresponding to the optical output from the LDs.

A photocurrent monitoring circuit, illustrated in FIG. 1, is conventionally employed as an optical transmitter that includes a plurality of LDs for outputting optical signals having a plurality of different wavelengths (see, for example, non-patent document 1). Logarithmic amplifiers LA1 to LAn, which convert photocurrents into voltages, are respectively connected to photodiodes PD1 to PDn, which monitor the optical output from LDs. The output of the logarithmic amplifiers LA1 to LAn is transmitted to a processor CPU via analog-digital converters ADC1 to ADCn. The processor CPU then sequentially reads, each 250 µs, the output of the analog-digital converters ADC1 to ADCn, and calculates the drive current values for the individual LDs. The processor CPU thereafter employs the obtained drive current values to control the drive circuit for the LDs.

A problem that has been encountered, however, is that although the logarithmic amplifiers LA1 to LAn are expensive, and one such amplifier must be provided for each photodiode, as a result, the costs involved in producing a photocurrent monitoring circuit becomes exceedingly high.

The objective of the present invention is to provide a low cost photocurrent monitoring circuit.

Non-patent Document 1: E. J. Newman, "Logarithmic Processing Applied to Network Power Monitoring", National Fiber Optic Conference, 2002 Tech. Proc. p. 1292-1298

DISCLOSURE OF THE INVENTION

To achieve this objective, according to one embodiment of the present invention, a photocurrent monitoring circuit, which performs monitoring by converting photocurrents output from a plurality of photodiodes into voltages, comprises a multiplexer circuit for selecting one of input terminals to establish a connection of the selected input terminal to an output terminal, wherein the photodiodes are respectively connected to the input terminals; and an amplifier for converting a photocurrent which flows from a selected photodiode via the multiplexer circuit into a voltage, and for outputting the voltage.

According to another embodiment of the present invention, a photocurrent monitoring circuit, which performs monitoring by converting photocurrents output from a plurality of photodiodes into voltages and by performing time division multiplexing for the obtained voltages, comprises a plurality of current mirror circuits respectively connected to each photodiode, for receiving each photocurrent and supplying a photocurrent having the same value as that of the received photocurrent; a multiplexer circuit for selecting one of input terminals to establish a connection of the selected input terminal to an output terminal, wherein the current mirror circuits are respectively connected to the input terminals; and an amplifier for converting a photocurrent which flows from a selected current mirror circuit via the multiplexer circuit into a voltage, and for outputting the voltage.

BEST MODE FOR CARRYING OUT THE INVENTION

Figure 1:
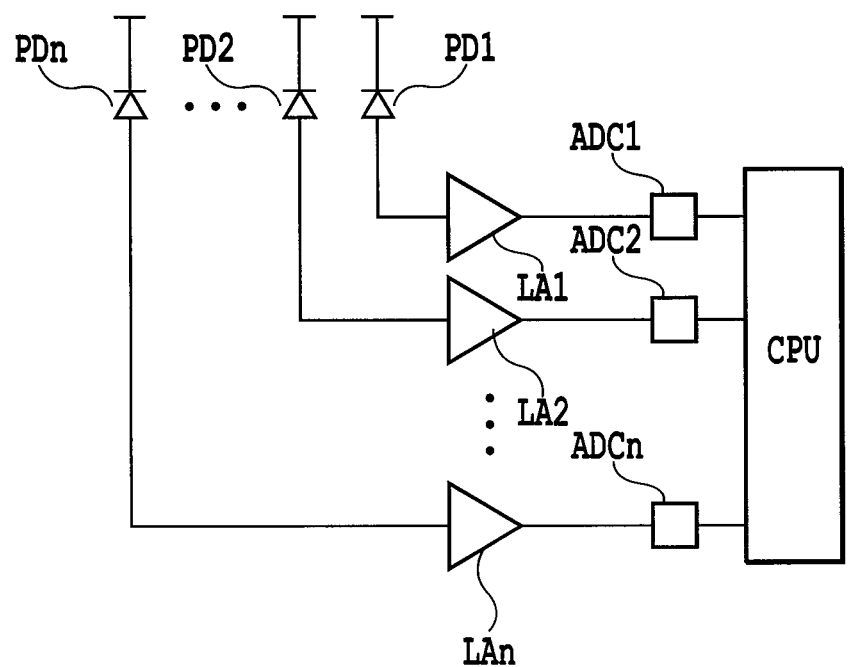
FIG. 1 is a circuit configuration diagram illustrating a conventional photocurrent monitoring circuit.
Figure 2:
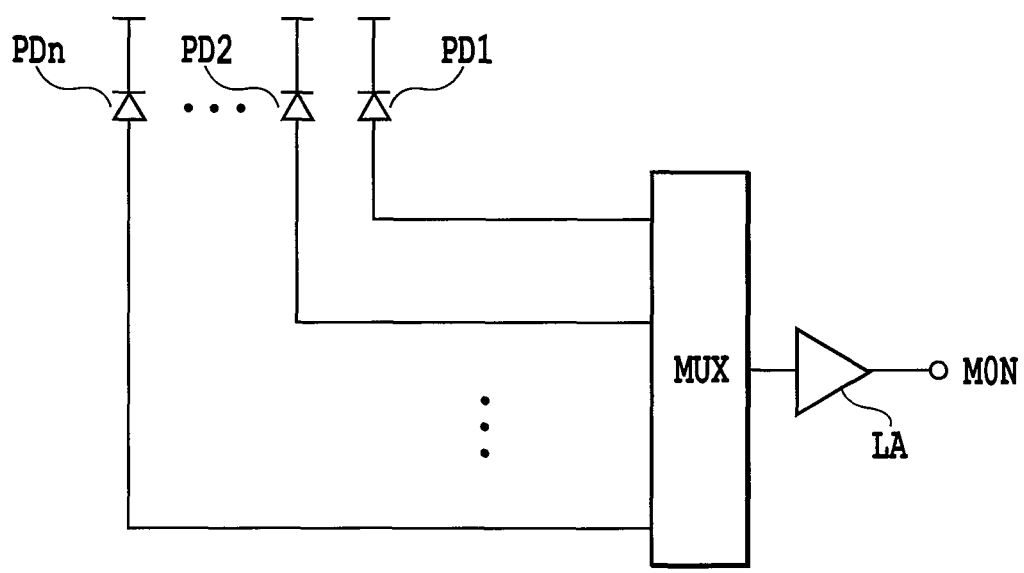
FIG. 2 is a diagram illustrating a photocurrent monitoring circuit according to a first embodiment of the present invention.

The embodiments of the present invention will now be described in detail while referring to drawings. A photocurrent monitoring circuit for a first embodiment of the present invention is shown in FIG. 2. Photodiodes PD1 to PDn, which monitor the optical output of LDs, are connected to the input terminals of a multiplexer circuit MUX. The output of the photodiodes PD1 to PDn is multiplexed by the multiplexer circuit MUX in a time division manner. The result is output to a drive circuit for the LDs via a logarithmic amplifier LA, which converts a photocurrent into a voltage, and a monitor terminal MON. At intervals of 5 ms, the multiplexer circuit MUX switches between the input terminals connected to the photodiodes PD1 to PDn, and connects a selected input terminal to the output terminal, so that the output of the photodiodes PD1 to PDn is transmitted to the input terminal of the logarithmic amplifier LA.

According to this arrangement, only one logarithmic amplifier LA is required on the output side of the multiplexer circuit MUX, and a low cost photocurrent monitoring circuit can be provided. For a case wherein a processor CPU is employed to control a drive circuit for LDs, as well as for a conventional photocurrent monitoring circuit, the output of the monitor terminal MON can be transmitted via an analog-digital converter ADC to the processor CPU.

Figure 3:
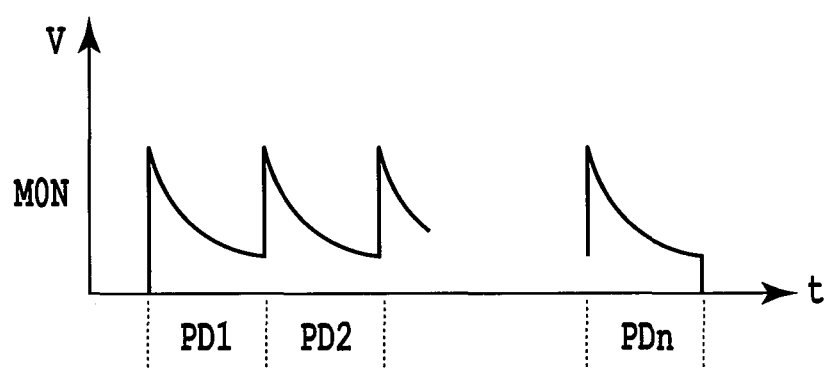
FIG. 3 is a diagram showing the output waveform for the photocurrent monitoring circuit.

When a load fluctuates, however, the output photocurrent of the photodiodes PD1 to PDn also changes. The impedance goes high when an input terminal of the multiplexer circuit MUX is not selected, and goes low when an input terminal is selected. Therefore, the photocurrent output from the photodiodes PD1 to PDn is changed, and accordingly, the output at the monitor terminal MON fluctuates. As described above, for a case wherein the multiplexer circuit MUX performs switching at intervals of several ms, a voltage can be obtained after the output at the monitor terminal MON has been stabilized. However, for a conventional case wherein the multiplexer circuit MUX performs switching at intervals of 250 μs, the voltage output at the monitor terminal MON fluctuates, as shown in FIG. 3. The LD drive circuit must therefore compensate for this fluctuation component, and as a result, the circuit structure becomes complicated.

Figure 4:
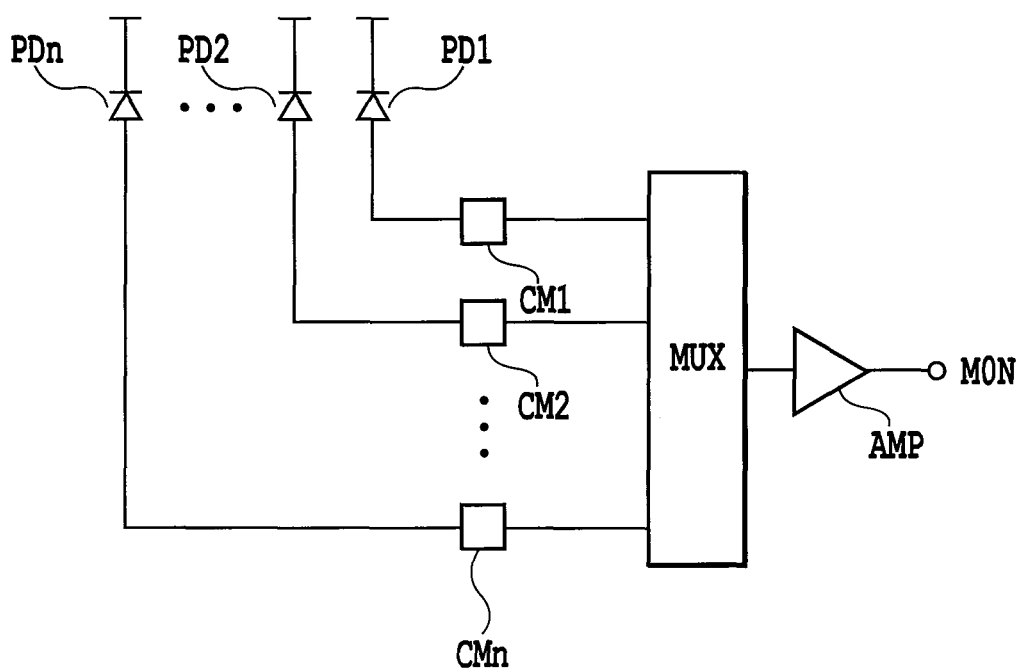
FIG. 4 is a diagram illustrating a photocurrent monitoring circuit according to a second embodiment of the present invention.

A photocurrent monitor circuit according to a second embodiment of the present invention is shown in FIG. 4. Current mirror circuits CM1 to CMn are respectively connected to photodiodes PD1 to PDn, which monitor the optical output of LDs. The output of the current mirror circuits CM1 to CMn is multiplexed by a multiplexer circuit MUX in a time division manner. The result is output to an LD drive circuit via an amplifier AMP, which converts a photocurrent into a voltage, and a monitor terminal MON. At intervals of 250 μs, the multiplexer circuit MUX switches between input terminals, which are connected to the current mirror circuits CM1 to CMn, and connects the selected input terminal to the output terminal, so that the output of the individual current mirror circuits CM1 to CMn is transmitted to the input terminal of the amplifier AMP.

According to this arrangement, because of the presence of the current mirror circuits CM1 to CMn, the photodiodes PD1 to PDn are not adversely affected by load fluctuations at the input terminals of the multiplexer circuit MUX. Furthermore, since only one amplifier AMP is required on the output side of the multiplexer circuit MUX, and the current mirror circuits CM1 to CMn can be formed using inexpensive transistor circuits, a low cost photocurrent monitoring circuit can be provide.

Figure 5:
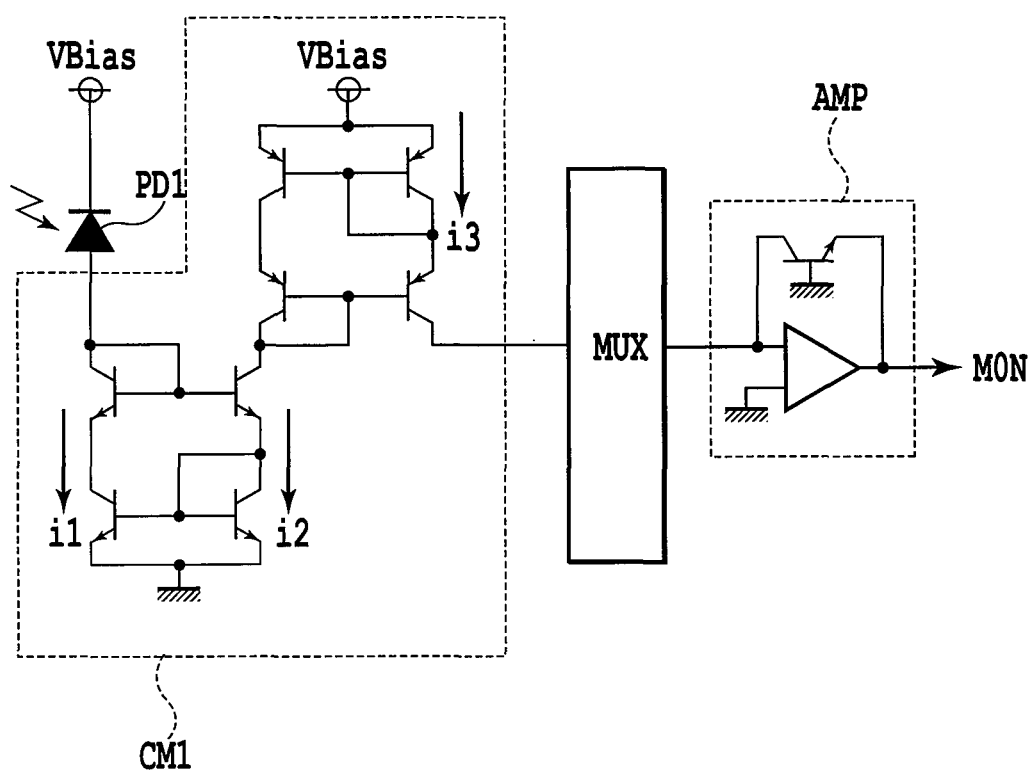
FIG. 5 is a circuit diagram illustrating a current mirror circuit according to a first example of the present invention.

A current mirror circuit according to a first example of the present invention is shown in FIG. 5. A photocurrent i1 output from the photodiode PD1 is transmitted to the current mirror circuit CM1, and is converted into a photocurrent i2. Furthermore, the photocurrent i2 is thereafter converted into a photocurrent i3, which is then emitted to the multiplexer circuit MUX. The current mirror circuit CM1, which outputs the photocurrent i3, has a low impedance output, and is not affected by load fluctuations at the input terminals of the multiplexer circuit MUX.

The photocurrent i3 is output to the amplifier AMP via the multiplexer circuit MUX. The amplifier AMP, which is a logarithmic amplifier, converts the photocurrent i3 into a voltage, and outputs the voltage to the monitor terminal MON.

Figure 6:
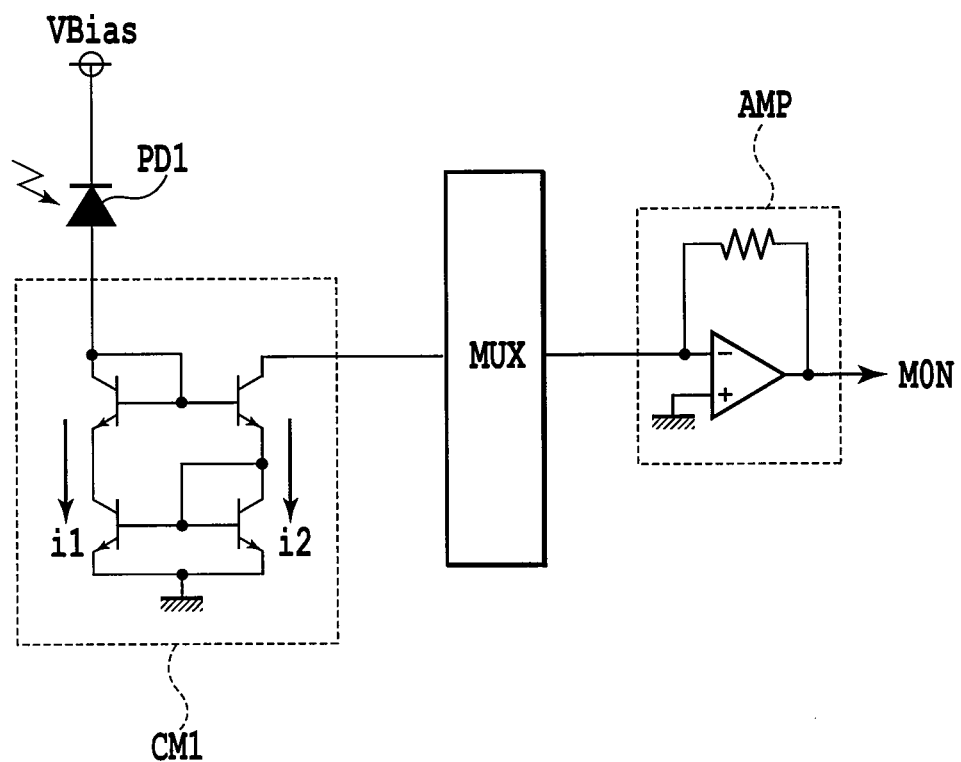
FIG. 6 is a circuit diagram illustrating a current mirror circuit according to a second example of the present invention.

A current mirror circuit according to a second example of the present invention is shown in FIG. 6. A photocurrent i1 output from the photodiode PD1 is transmitted to the current mirror circuit CM1, and is converted into a photocurrent i2. The photocurrent i2 is then supplied from the input terminal of the multiplexer circuit MUX. The current mirror circuit CM1, which induces the photocurrent i2, has a low impedance input, and is not affected by load fluctuations at the input terminals of the multiplexer circuit MUX.

The photocurrent i2 is transmitted via the multiplexer circuit MUX, from the amplifier AMP. And the amplifier AMP, which is a trans-impedance amplifier, converts the photocurrent i2 into a voltage, which is then output at the monitor terminal MON.

The invention claimed is:

1. A photocurrent monitoring circuit, which performs monitoring by converting photocurrents output from a plurality of photodiodes into voltages and by performing time division multiplexing for the obtained voltages, comprising:
a plurality of current mirror circuits respectively connected to each photodiode, for receiving each photocurrent and supplying a photocurrent having the same value as that of the received photocurrent, each current mirror circuit comprising:
a first current mirror configured to convert the photocurrent received from the photodiode into an intermediate photocurrent; and
a second current mirror configured to convert the intermediate photocurrent into the photocurrent supplied by the current mirror circuit;
a multiplexer circuit for selecting one of input terminals to establish a connection of the selected input terminal to an output terminal, wherein the current mirror circuits are respectively connected to the input terminals; and
an amplifier for converting a photocurrent which flows from a selected current mirror circuit via the multiplexer circuit into a voltage, and for outputting the voltage, wherein the current mirror circuits are configured to sink current from the photodiodes and source current to the amplifier.

2. A photocurrent monitoring circuit according to claim 1, wherein the amplifier is a logarithmic amplifier, and converts a photocurrent emitted by the current mirror circuits into a voltage.

3. A photocurrent monitoring circuit according to claim 1, wherein the amplifier is a trans-impedance amplifier, and converts a photocurrent induced by the current mirror circuits into a voltage.

4. The photocurrent monitoring circuit recited in claim 1, wherein the current mirror circuits are connected to anodes of the photodiodes.

5. A circuit for monitoring photocurrents output from a plurality of photodiodes and converting the photocurrents to a multiplexed voltage signal, the circuit comprising:
a plurality of current mirror circuits, each current mirror circuit having an input and an output, each input being configured to respectively electrically connect to a separate one of the photodiodes, each current mirror circuit being configured to provide a photocurrent at the output having a same value as a photocurrent at the input, each current mirror circuit comprising:
a first current mirror configured to convert the photocurrent received at the input into an intermediate photocurrent; and
a second current mirror configured to convert the intermediate photocurrent into the photocurrent provided at the output;
a multiplexer circuit having a plurality of input terminals and an output terminal, each of the input terminals being electrically connected to a separate one of the outputs of the current mirror circuits, the multiplexer circuit being configured to electrically connect each of the input terminals to the output terminal in a time division multiplexed manner so as to output the photocurrents of each of the outputs of the current mirrors, interleaved with each other; and
an amplifier electrically connected to the output terminal of the multiplexer circuit, the amplifier being configured to convert the interleaved photocurrents into a multiplexed voltage signal, wherein the current mirror circuits are configured to sink current from the photodiodes and source current to the amplifier.

6. The circuit recited in claim 5, wherein the amplifier comprises a logarithmic amplifier configured to convert a photocurrent emitted by the current mirror circuits into a voltage.

7. The circuit recited in claim 5, wherein the amplifier comprises a trans-impedance amplifier configured to convert a photocurrent induced by the current mirror circuits into a voltage.

8. The circuit recited in claim 5, wherein the output of each current mirror circuit has a low impedance so as to be unaffected by load fluctuations at the input terminals of the multiplexer circuit.

9. The circuit recited in claim 5, wherein the input of each current mirror circuit is configured to respectively electrically connect to an anode of one of the photodiodes.

10. A circuit for monitoring photocurrents output from a plurality of photodiodes and converting the photocurrents to a multiplexed voltage signal, the circuit comprising:

a plurality of current mirror circuits, each current mirror circuit having an input and an output, each input being configured to respectively electrically connect to a separate one of the photodiodes, each current mirror circuit being configured to provide a photocurrent at the output having a same value as a photocurrent at the input, each current mirror circuit comprising two or more pairs of transistors, bases of the transistors in each pair being electrically connected together;

a multiplexer circuit having a plurality of input terminals and an output terminal, each of the input terminals being electrically connected to a separate one of the outputs of the current mirror circuits, the multiplexer circuit being configured to electrically connect each of the input terminals to the output terminal in a time division multiplexed manner so as to output the photocurrents of each of the outputs of the current mirrors, interleaved with each other; and an amplifier electrically connected to the output terminal of the multiplexer circuit, the amplifier being configured to convert the interleaved photocurrents into a multiplexed voltage signal.

11. The circuit recited in claim 10, wherein the amplifier comprises a logarithmic amplifier configured to convert a photocurrent emitted by the current mirror circuits into a voltage.

12. The circuit recited in claim 10, wherein the amplifier comprises a trans-impedance amplifier configured to convert a photocurrent induced by the current mirror circuits into a voltage.

13. The photocurrent monitoring circuit recited in claim 10, wherein the input of each current mirror circuit is configured to respectively electrically connect to an anode of one of the photodiodes.

* * * * *